US009730353B2

(12) United States Patent
Bury et al.

(10) Patent No.: US 9,730,353 B2
(45) Date of Patent: Aug. 8, 2017

(54) COMPONENT ASSEMBLY SYSTEM

(71) Applicant: Phoenix Contact GmbH Co. KG, Blomberg (DE)

(72) Inventors: Joachim Bury, Herford (DE); Thomas Salomon, Verl (DE)

(73) Assignee: PHOENIX CONTACT GMBH & CO. KG, Blomberg (DE)

(*) Notice: Subject to any disclaimer, the term of this patent is extended or adjusted under 35 U.S.C. 154(b) by 0 days.

(21) Appl. No.: 15/033,534

(22) PCT Filed: Nov. 3, 2014

(86) PCT No.: PCT/EP2014/073545
§ 371 (c)(1),
(2) Date: Apr. 29, 2016

(87) PCT Pub. No.: WO2015/063291
PCT Pub. Date: May 7, 2015

(65) Prior Publication Data
US 2016/0278228 A1 Sep. 22, 2016

(30) Foreign Application Priority Data
Nov. 4, 2013 (DE) .................. 10 2013 112 099

(51) Int. Cl.
*H01R 11/03* (2006.01)
*H05K 7/14* (2006.01)
(52) U.S. Cl.
CPC ........... *H05K 7/1401* (2013.01); *H01R 11/03* (2013.01); *H05K 7/1468* (2013.01); *H05K 7/1474* (2013.01); *H05K 7/1478* (2013.01)

(58) Field of Classification Search
CPC .. H05K 7/1401; H05K 7/1468; H05K 7/1474; H05K 7/1478; H01R 11/03
(Continued)

(56) References Cited

U.S. PATENT DOCUMENTS 5,775,955 A * 7/1998 Graube ................ H01R 9/2408
439/716
8,147,257 B2 * 4/2012 Bury ........................ H02B 1/21
439/110

FOREIGN PATENT DOCUMENTS

DE 32 48 124 A1 7/1984
DE 44 02 002 A1 7/1995
(Continued)

OTHER PUBLICATIONS

ISA/EP, International Search Report, Int'l Application No. PCT/EP2014/073545, Nov. 3, 2015, European Patent Office, Rijswijk, NL, 10 pgs.

*Primary Examiner* — Edwin A. Leon
(74) *Attorney, Agent, or Firm* — Holland & Hart LLP

(57) ABSTRACT

A component assembly system includes a supporting profiled rail, a functional component, and a bridging module configured to electrically connect to the functional component. The bridging module includes a module retention device configured to hold the bridging module on the supporting profiled rail. The functional component is configured to partly seat onto the bridging module, and includes a component retention device configured to hold the functional component on the supporting profiled rail. A locking slide is configured to releasably fix a functional component to a supporting profiled rail. The locking slide is configured to positively engage around the supporting profiled rail.

17 Claims, 11 Drawing Sheets

(58) Field of Classification Search
USPC ......... 439/709–710, 712–717, 532, 928, 651
See application file for complete search history.

(56) References Cited

FOREIGN PATENT DOCUMENTS

| | | |
|---|---|---|
| DE | 100 12 764 A1 | 9/2001 |
| DE | 10 2004 019 173 A1 | 11/2005 |
| DE | 10 2011 101 078 A1 | 11/2011 |
| EP | 0 236 711 A2 | 9/1987 |
| EP | 0 527 247 B1 | 2/2000 |
| EP | 1901598 A1 | 3/2008 |
| EP | 2157845 A1 | 2/2010 |
| WO | WO-0062376 A1 | 10/2000 |

\* cited by examiner

COMPONENT ASSEMBLY SYSTEM

CROSS-REFERENCE TO RELATED APPLICATION

The present application is a 373 national phase filing of International Application No. PCT/EP2014/073545, entitled "Component Assembly System", filed Nov. 3, 2014, which claims priority to German Patent Application No. 10 2013 112 099.7, entitled "Komponentenaufbausystem", filed Nov. 4, 2013.

BACKGROUND

Modern component systems in automation technology typically consist of a plurality of functional components arranged in a control cabinet. The energy and data distributing functions are realized by separate connector systems. Assembly without control cabinets is not possible since peripheral devices near the control cabinet hinge on a radial distribution of energy. If field bus concepts are used in which individual components are set onto backplanes, the backplanes are subject to high forces of weight.

The disclosure WO 2004/075356 A1 describes a modular electrical device in which the individual functional components are mounted on backplanes.

SUMMARY

The task underlying the present disclosure is that of specifying a component assembly system able to simplify the assembling of the functional components.

This task is solved by the subject matter features according to the independent claims. Advantageous examples of these features are provided in the figures, the description and the dependent claims.

According to a first set of examples, the task is solved by a component assembly system having a supporting profiled rail, by a functional component; a bridging module for electrically connecting a functional component which comprises a module retention device for holding the bridging module on the supporting profiled rail; wherein the functional component is designed to partly seat onto the bridging module, and wherein the functional component comprises a component retention device for holding the functional component on the supporting profiled rail. This for example thereby achieves the technical advantage of the weight of the functional component bearing on the supporting profiled rail instead of on the bridging module.

The component assembly system can for example be a field bus system.

In one advantageous example, the module retention device is designed to produce a snap-lock connection between the bridging module and the supporting profiled rail.

In a further advantageous example, the module retention device can be snapped onto the supporting profiled rail, particularly by a pivoting of the bridging module.

In a further advantageous example of the component assembly system, the module retention device comprises a rigid retention element engaging around the supporting profiled rail and an elastically flexible retention element opposite the rigid retention element for latching onto the supporting profiled rail.

In a further advantageous example of the component assembly system, the supporting profiled rail exhibits an undercut profile which interacts with the module retention device and/or the component retention device.

In a further advantageous example of the component assembly system, the supporting profiled rail is designed as a multiple-piece system having a first and a second supporting profiled element or is designed as a single-piece system.

In a further advantageous example of the component assembly system, the bridging module and/or the functional component is/are displaceable on or along the supporting profiled rail.

In a further advantageous example of the component assembly system, the component assembly system comprises a clamping element for fixing the bridging module against displaceability on the supporting profiled rail, wherein the clamping element is connectable to the bridging module.

In a further advantageous example of the component assembly system, the clamping element is friction-lock or form-lock connectable to the bridging module, particularly by means of a T-slot/groove connection, a dovetail connection, a screwed connection or a clamped connection.

In a further advantageous example of the component assembly system, the clamping element is designed to positively engage around and/or frictionally clamp the supporting profiled rail.

In a further advantageous example of the component assembly system, the clamping element has an externally conducting grounding connection which is electro-conductively connectable to the supporting profiled rail.

In a further advantageous example of the component assembly system, the bridging module has plug connections for electrically connecting to the functional component.

In a further advantageous example of the component assembly system, the functional component and the bridging module are connectable in a form-fit connection, particularly a tongue-and-groove connection, to absorb the tensile forces acting on the connection between the connecting module and the functional component along a supporting profiled rail.

In a further advantageous example of the component assembly system, the functional component comprises a first component retention device for a first supporting profiled element and a second component retention device for a second supporting profiled element.

In a further advantageous example of the component assembly system, the supporting profiled rail can be mounted on a surface, e.g. by means of screwed connections.

In a further advantageous example of the component assembly system, the component retention device comprises a displaceable locking slide for engaging under or positively engaging around the supporting profiled rail.

In a further advantageous example of the component assembly system, the locking slide is displaceable on the functional component between an extended locking position for engaging under or positively engaging around the functional component on the supporting profiled rail and a retracted release position for seating the functional component on the supporting profiled rail.

In a further advantageous example of the component assembly system, the locking slide comprises a pressure spring for aiding the motion of the locking slide into the extended locking position bearing the locking slide against a housing wall of the functional component.

In a further advantageous example of the component assembly system, the locking slide comprises a locking arm for latching the locking slide into the locking position and for latching the locking slide into the release position.

In a further advantageous example of the component assembly system, the component retention device comprises a first latch opening and a second latch opening for the locking arm.

In a further advantageous example of the component assembly system, the locking slide comprises a fixing spring arm for fixing the locking slide in the release position.

In a further advantageous example of the component assembly system, the fixing spring arm comprises a pressure element for pressing the fixing spring arm into a disengaging position in which the locking slide can be displaced into the locking position.

In a further advantageous example of the component assembly system, the component assembly system is designed such that the pressure element is actuatable upon the seating of the functional component on the supporting profiled rail.

In a further advantageous example of the component assembly system, the locking slide comprises a supporting section for the support of the fixing spring arm.

In a further advantageous example of the component assembly system, the locking slide comprises an opening for the insertion of a tool for displacing the locking slide.

In a further advantageous example of the component assembly system, the functional component can be set onto the bridging module, and wherein the module retention device can be covered by an edge of the functional component housing and thus able to be locked or blocked from actuating.

According to a second set of examples, the task is solved by a locking slide for releasably fixing a functional component to a supporting profiled rail, wherein the locking slide is designed to positively engage around the supporting profiled rail.

In a further advantageous example of the locking slide, the locking slide is displaceable into an extended locking position for engaging under the functional component on the supporting profiled rail, and wherein the locking slide is displaceable into a retracted release position for seating the functional component on the supporting profiled rail.

In a further advantageous example of the locking slide, the locking slide comprises a pressure spring for aiding the motion of the locking slide into the extended locking position.

In a further advantageous example of the locking slide, the locking slide comprises a locking arm for latching the locking slide into the locking position and for latching the locking slide into the release position.

In a further advantageous example of the locking slide, the locking slide comprises a first latch opening and a second latch opening for the locking arm.

In a further advantageous example of the locking slide, the locking slide comprises a fixing spring arm for fixing the locking slide in the release position.

In a further advantageous example of the locking slide, the fixing spring arm comprises a pressure element for pressing the fixing spring arm into a disengaging position in which the locking slide can be displaced into the locking position.

In a further advantageous example of the locking slide, the pressure element is actuatable upon the seating of the functional component on the supporting profiled rail.

In a further advantageous example of the locking slide, the locking slide comprises a supporting section for the support of the fixing spring arm.

In a further advantageous example of the locking slide, the locking slide comprises an opening for the insertion of a tool for displacing the locking slide.

The locking slide according to the second set of examples can incorporate the features of the locking slide according to the first set of examples.

Example embodiments of the invention are depicted in the drawings and will be described in greater detail below.

BRIEF DESCRIPTION OF THE DRAWINGS

Additional exemplary embodiments are explained with reference to the accompanying drawings, in which Additional examples are depicted in the drawings and will be described in greater detail below.

DETAILED DESCRIPTION

Figure 1:
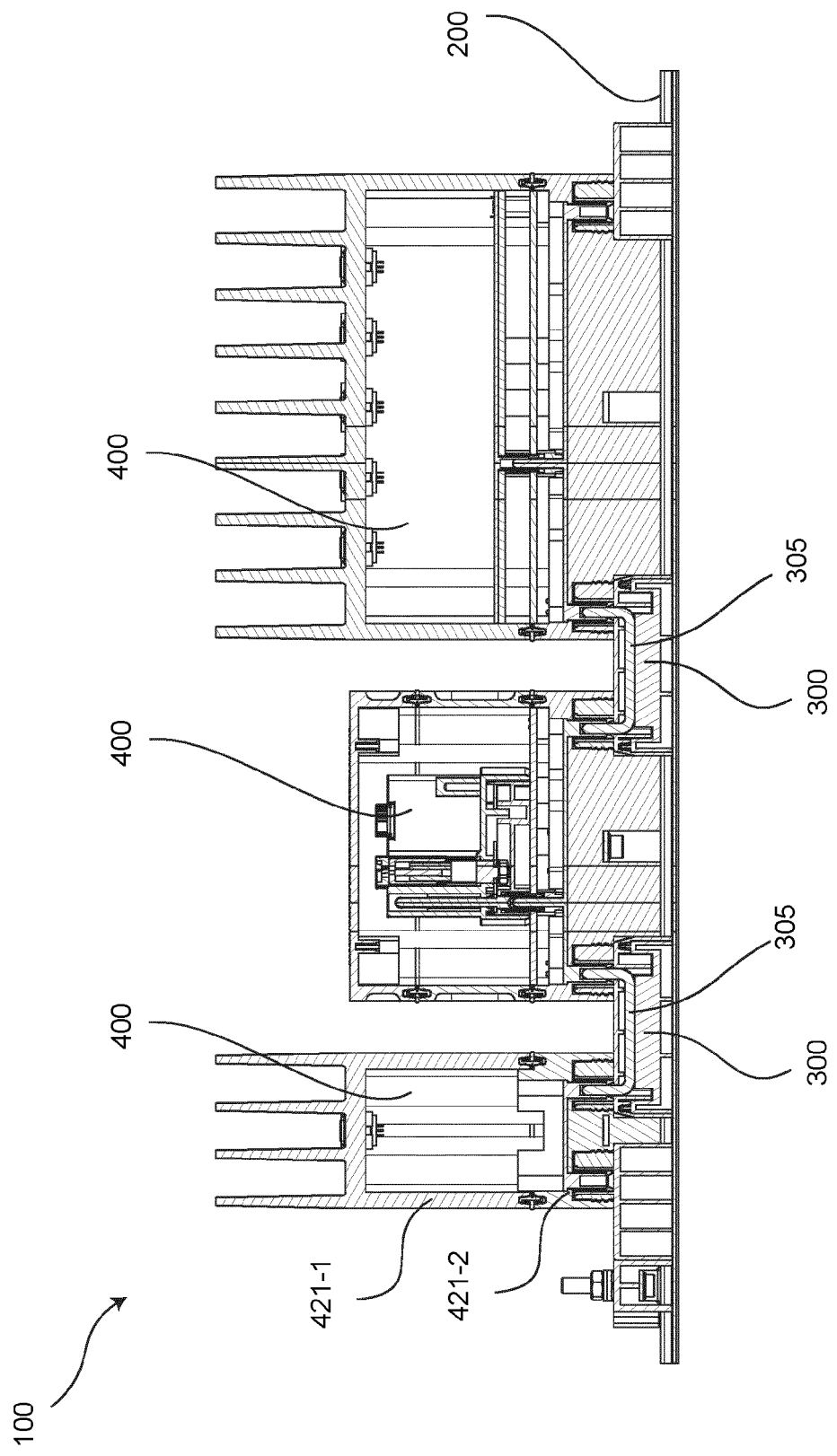
FIG. 1 shows a cross-sectional view of a component assembly system.

FIG. 1 shows a cross-sectional view of a component assembly system 100. The component assembly system 100 is composed of connectable housing modules with which the components are latched onto a supporting profiled rail 200. The structural concept of the component assembly system 100 encompasses a supporting profiled rail 200, bridging modules 300 and functional components 400, each consisting of a connective bottom part and a functional upper part.

Different embodiments of the structural concept can be realized depending on the intended application. The structural concept is infinitely extensible. The internal electrical connections for energy distribution of for example 400V or 24V and the data bus are realized simultaneously with plugging the components together. The connecting functions are realized in the housing bottom part 421-2 of functional components 400 and the bridging modules 300 by bridging plugs 305. The supplying, shielding, switching functions result from the sequential arrangement of the functional components 400. The application functions, such as for example supplying, shielding and switching, are realized in the housing upper part 421-1 which is connected to the housing lower part 421-2 by plug contacts.

The housing upper part 421-1 has a defined mechanical and electrical interface with the housing bottom part 421-2 and can also be used with other housing bottom parts 421-2 having the same interface. The housing bottom part 421-2 only incorporates the connection system. The separating, shielding or switching functions, for example, are incorporated in the housing upper part 421-1. The direction of action of the above-cited functions is effected in the line and/or in the load outflow dependent on the housing upper part 421-1 and the housing bottom part 421-2; i.e. a plug connection in the housing upper part 421-1. The connectivity can be disengaged in the housing bottom part 421-2.

The supporting profiled rail 200 forms a one-piece supporting system with a wide rail for a rack mount which emulates the geometry of the supporting edges of the bridging module 300 and the functional components 400. Alternatively, two separate standard supporting profiled rails can be used as a two-piece supporting system, e.g. 35 mm wide, for a wall mount. The supporting profile can be formed by a top-hat profile.

Figure 2:
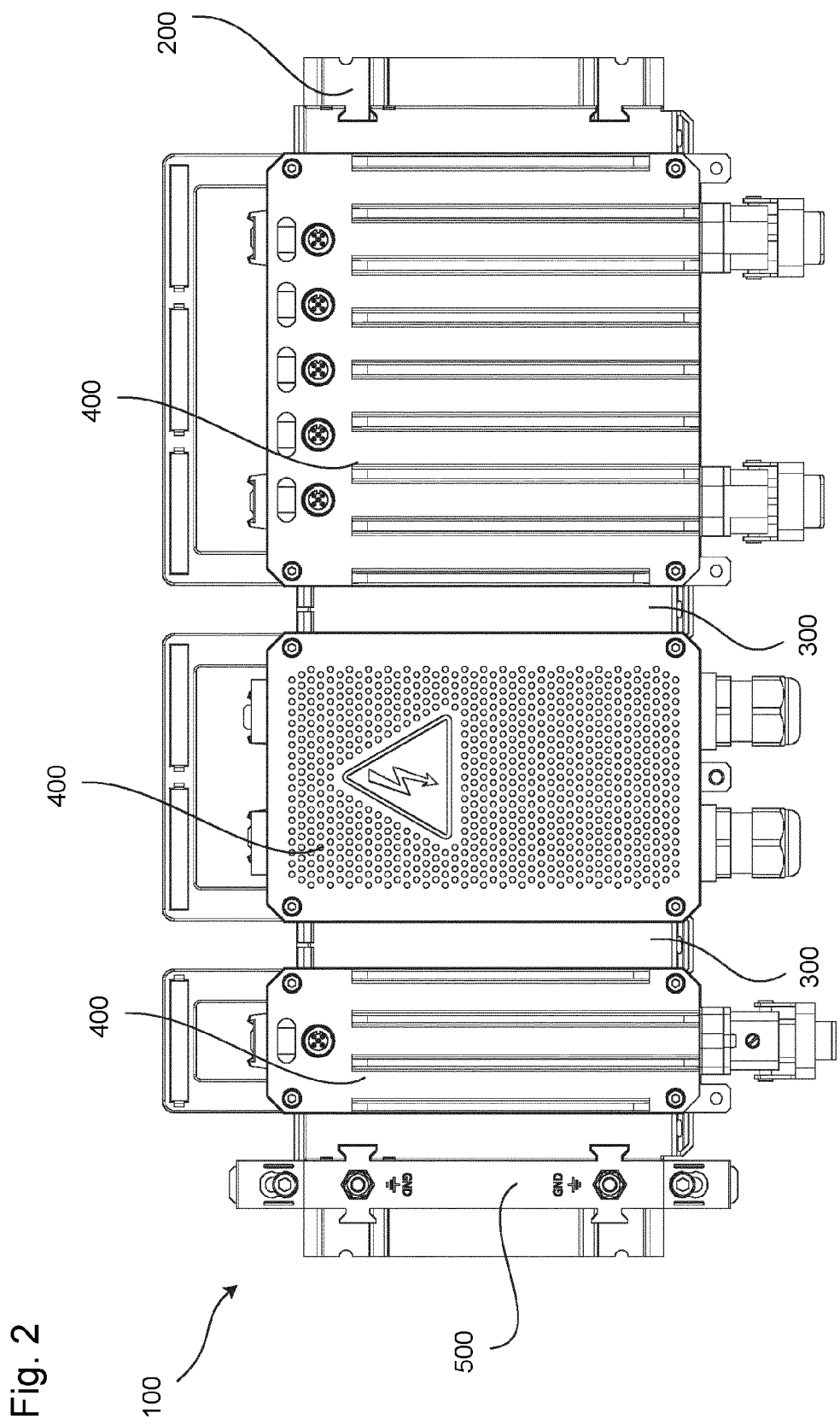
FIG. 2 shows a top view of the component assembly system.

FIG. 2 shows a view of the component assembly system 100. Latchable bridging modules 300 with forward-facing bridging plugs 305 are snapped onto the supporting profiled rails 200 as an electrical connection for energy distribution and the data bus. The mounting direction of the bridging module is perpendicular to the plane spanned by the supporting profiled rails 200.

The terminal block 500 as the clamping element fixes the entire system to a fixed point on the supporting profiled rail 200 in the x direction. With this configuration, the system structure can freely distend in the x direction from a fixed point, such as for example upon a thermally-induced longitudinal expansion. The mechanical clamping of this fixed point is at the same time the central electrical grounding and connection to the supporting profiled rail of the system assembly.

Figure 3:
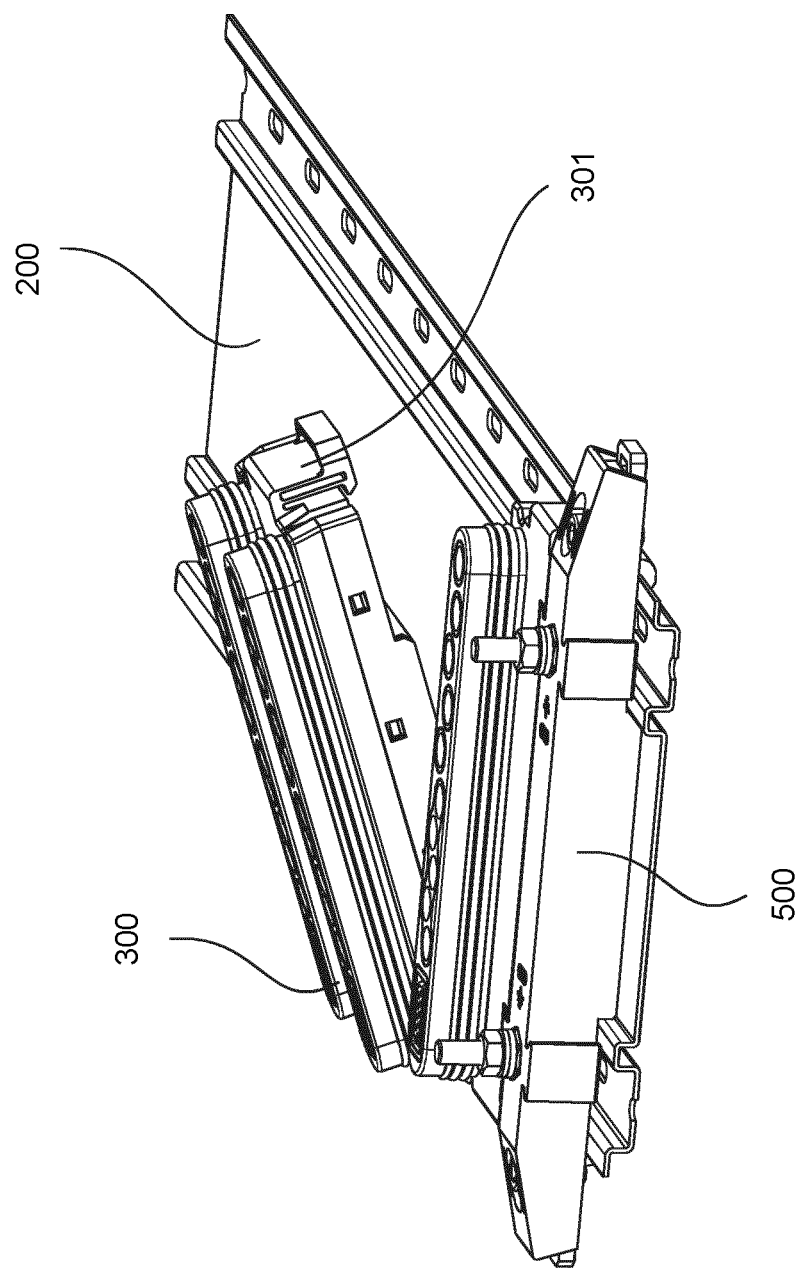
FIG. 3 shows a perspective view of a supporting profiled rail with a bridging module.

FIG. 3 shows a perspective view of a supporting profiled rail 200 with the bridging module 300. The bridging module 300 comprises the plug contacts and a module locking device 301 for latching the bridging module 300 onto the supporting profiled rail 200 when the bridging module 300 is being seated. The bridging modules 300 are freely displaceable along the supporting profiled rail 200 after being latched on.

Figure 4:
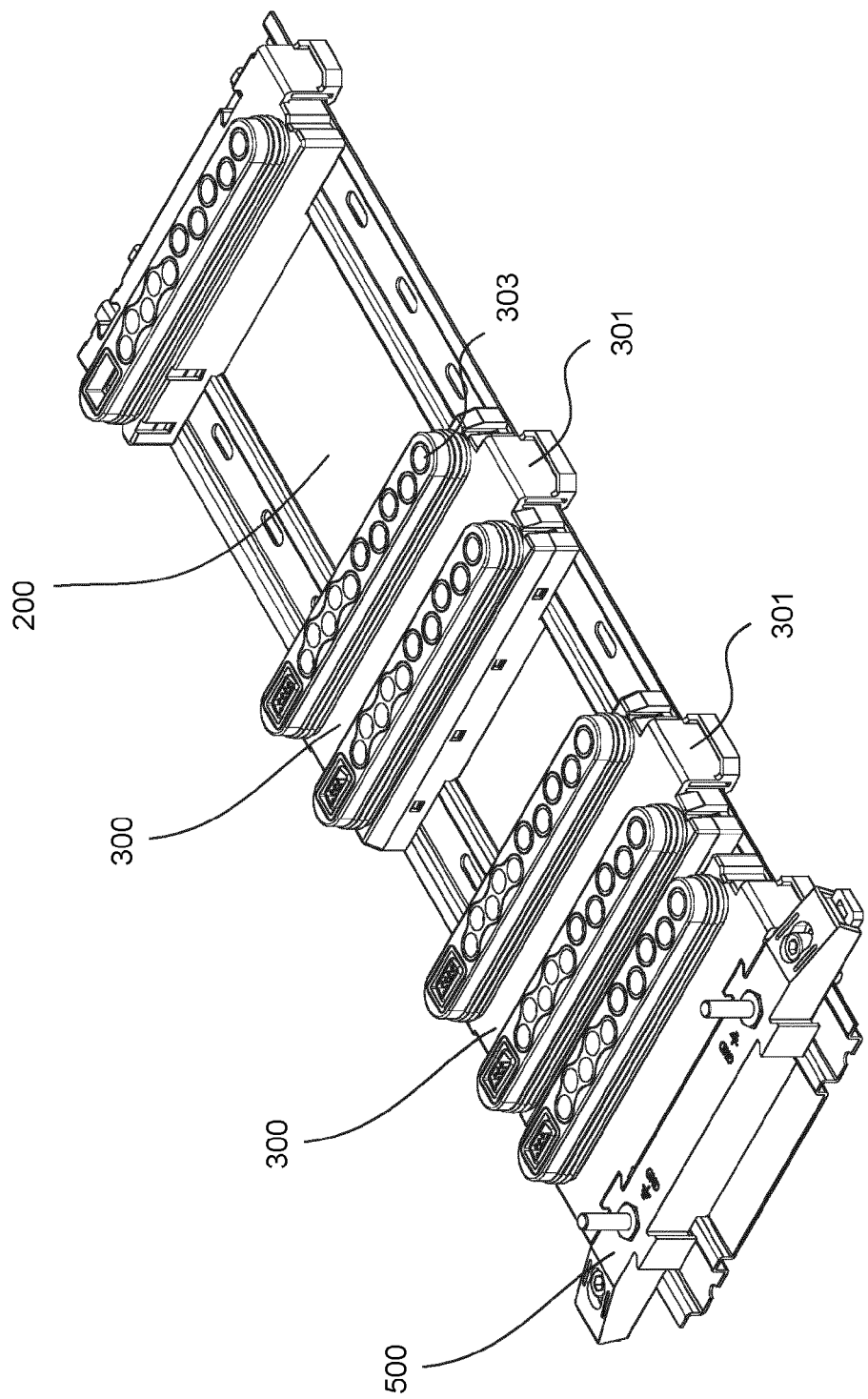
FIG. 4 shows a further perspective view of the supporting profiled rail with multiple bridging modules.

FIG. 4 shows a further perspective view of the supporting profiled rail 200 with multiple bridging modules 300. The bridging modules 300 can be realized in different widths so that the bridging modules 300 dictate the distance between joined functional components 400. This spacing defines a ventilation channel between the functional components 400 which for example comprises a metallic housing upper part 421-1 as a heat sink.

Figure 5:
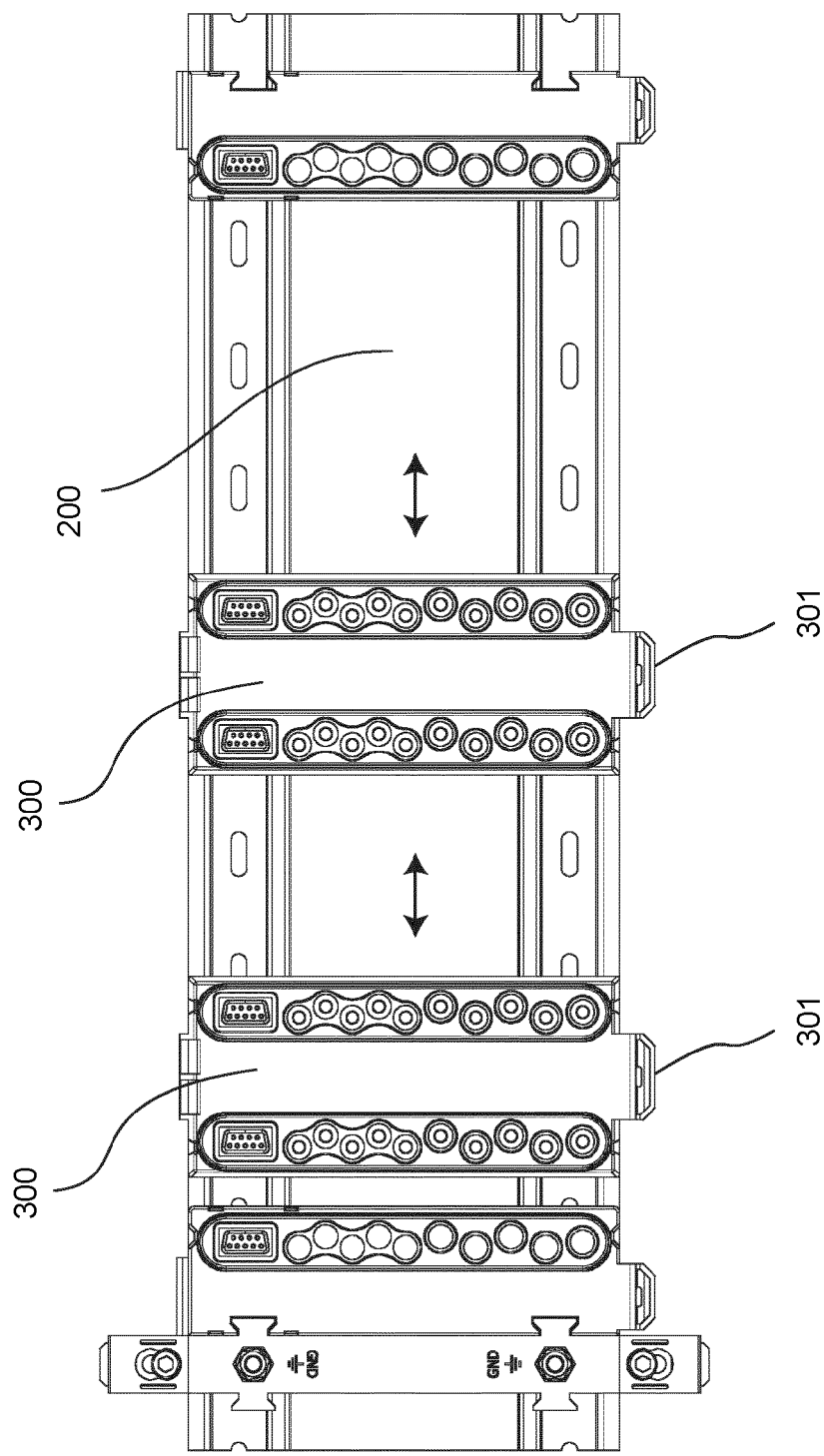
FIG. 5 shows a view of the supporting profiled rail with a plurality of bridging modules.

FIG. 5 shows a view of the supporting profiled rail 200 with multiple bridging modules 300. The bridging modules 300 are laterally displaceable in the direction of the arrow in the mounted state. The free displaceability of the bridging module 300 enables, albeit not imperatively, a non-locked mounting on the supporting profiled rail 200. The mechanical positioning of the functional components 400 in the remote location is generally unrestricted. The line's arrangement and sequence determine function.

Figure 6:
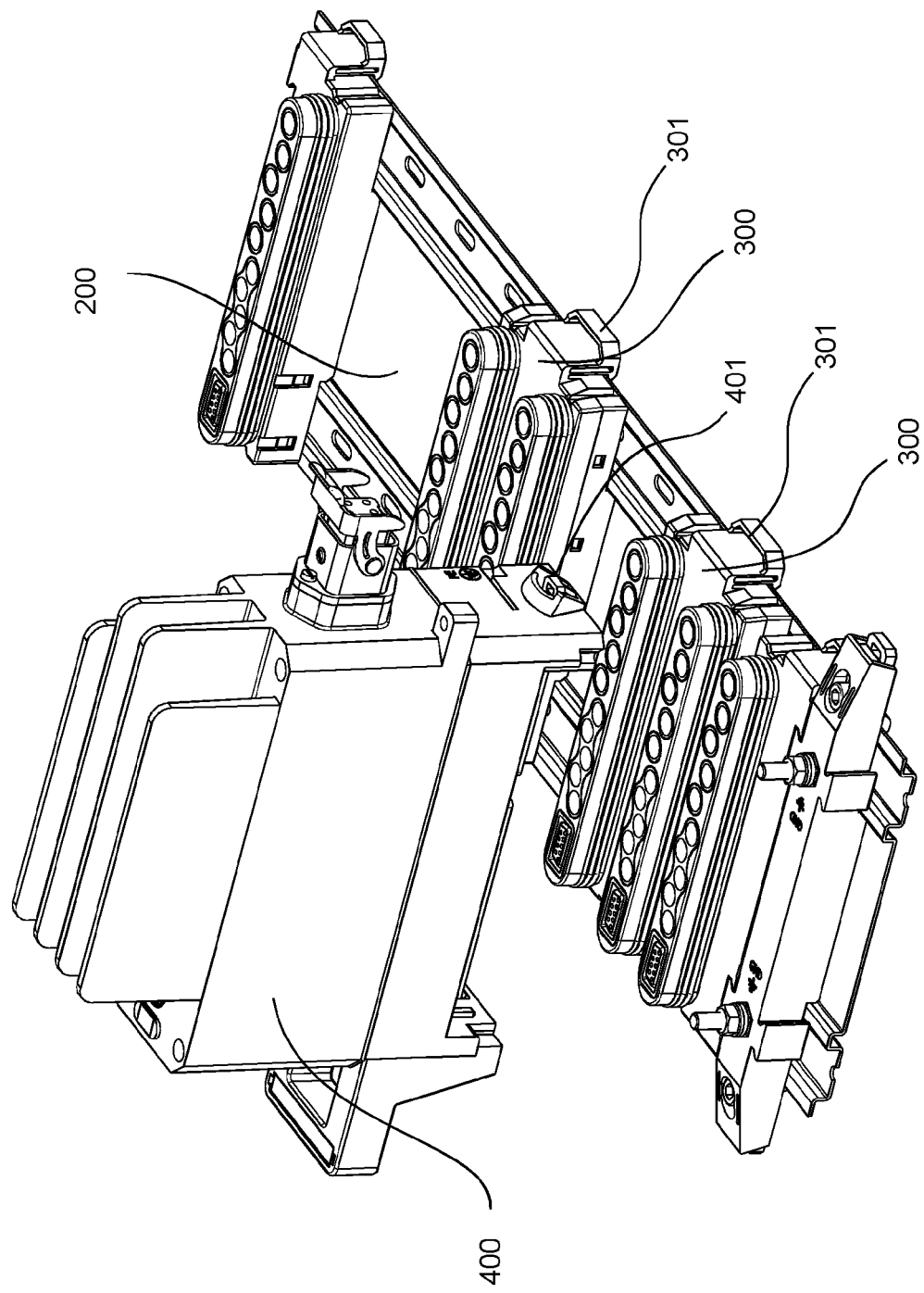
FIG. 6 shows a perspective view of the supporting profiled rail with the bridging module and a functional component.

FIG. 6 shows a perspective view of the supporting profiled rail 200 with the bridging modules 300 and the functional component 400. The functional component 400 is seated perpendicularly onto the supporting profiled rail 200 so that it pairs with two suitably positioned bridging modules 300 to the left and right on the plug connector 305. This assembly method allows consistent solutions within and external of a control cabinet and provides an alternative to contact rail-based distributions in the control cabinet.

Figure 7:
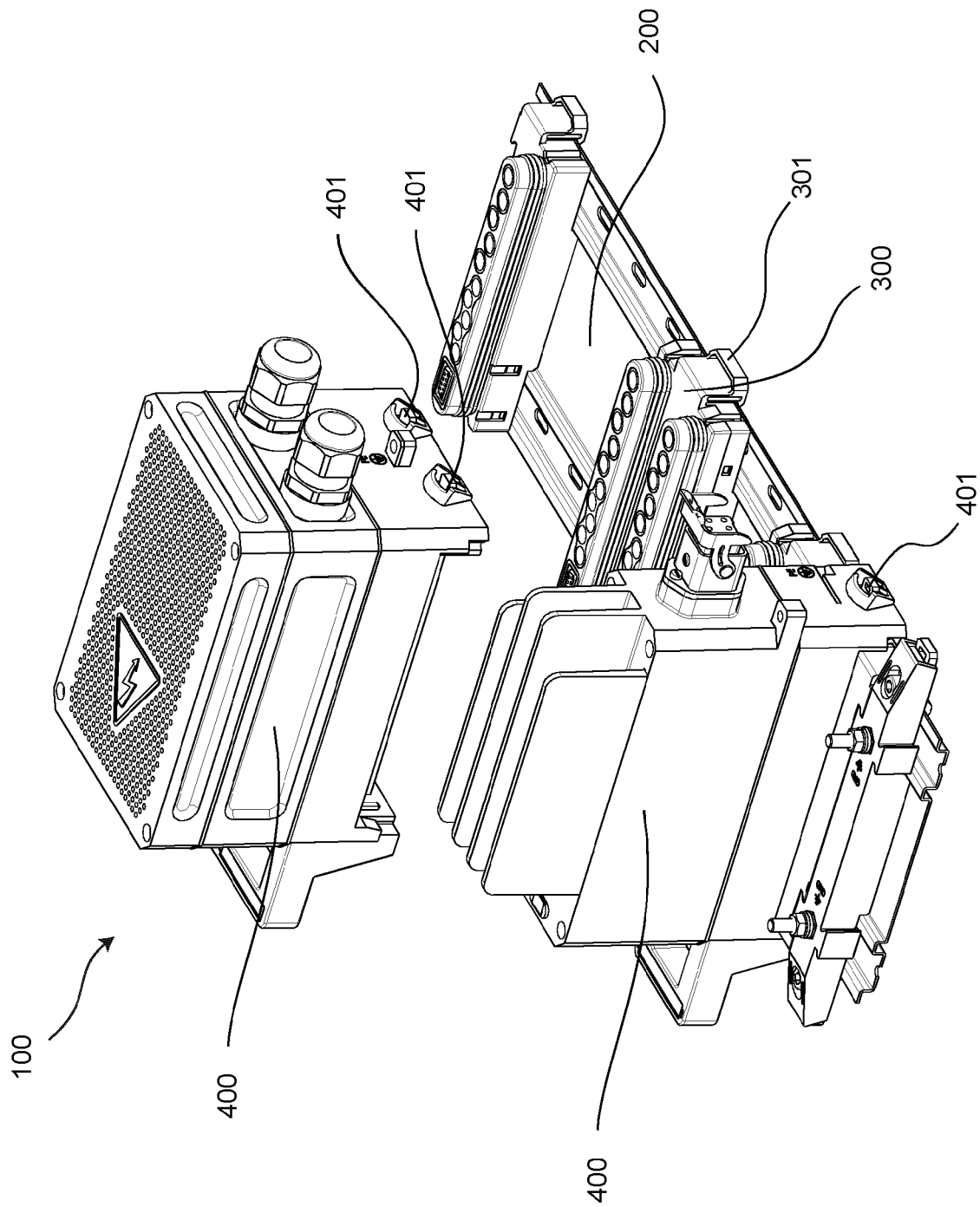
FIG. 7 shows a further perspective view of the supporting profiled rail with a plurality of bridging modules and functional components.

FIG. 7 shows a further perspective view of the supporting profiled rail 200. After the first functional component 400 has been seated, a second functional component 400 is seated on the supporting profiled rail 200. The bridging modules 200 are thereby displaceable such that they can be adjusted to the width of the respective functional component 400. The combination of functional component 400 and bridging module 300 on the supporting profiled rail 200 can also still be displaced after having been seated and joined. A latching and displacing of the bridging modules 300 and functional components 400, an assembly with locking from above and below, and a flow of current are possible in the joined assemblage. The functional components 400 can be mechanically fixed or attached to the bridging modules 300 so they can absorb drawing and insertion forces for the further assembly or disassembly of the functional components 400.

Figure 8:
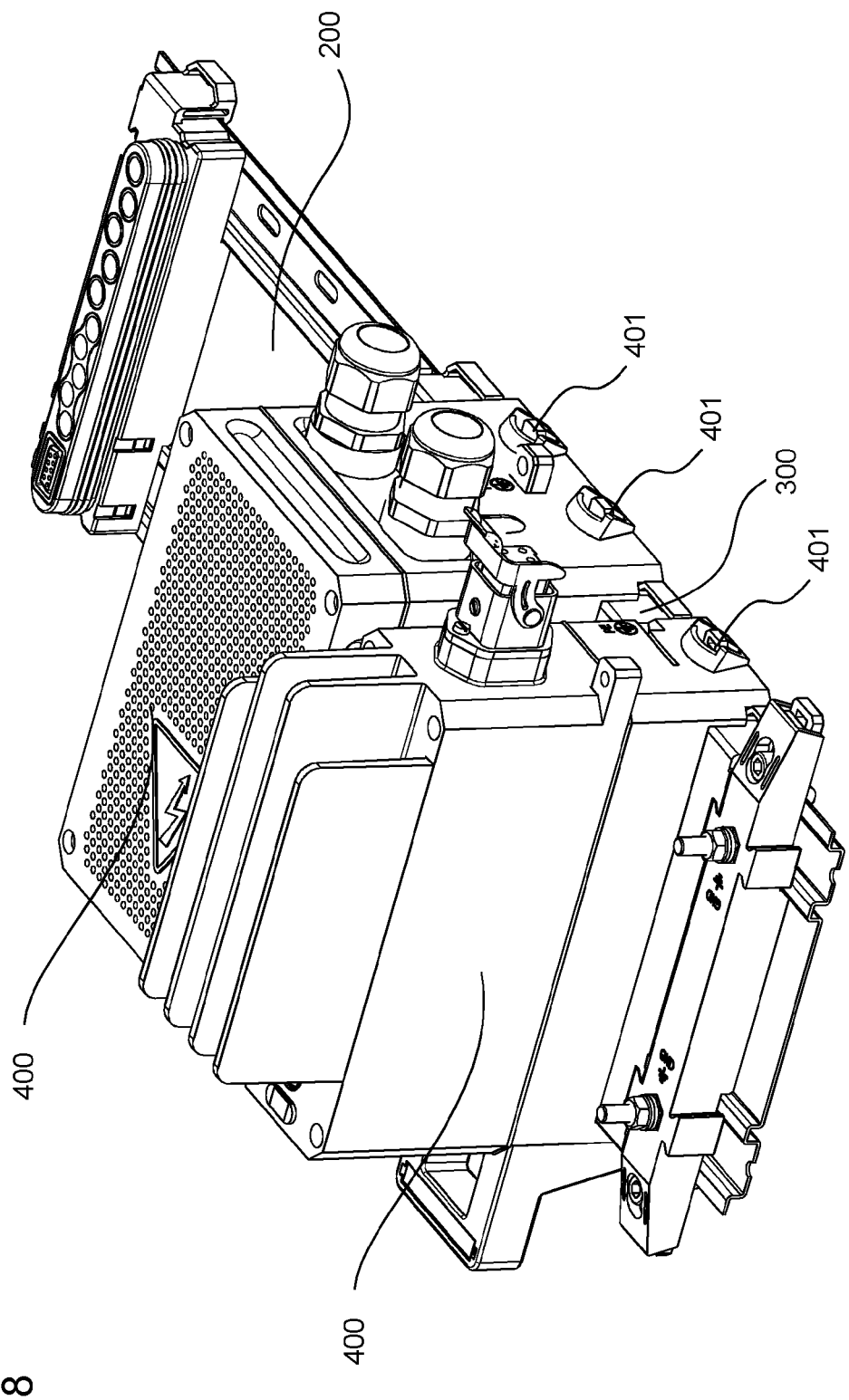
FIG. 8 shows a further perspective view of the supporting profiled rail with a plurality of bridging modules and functional components.

FIG. 8 shows a further perspective view of the supporting profiled rail 200 with multiple bridging modules 300 and functional components 400. After mounting and positioning of the full joined combination of bridging modules 300 and functional components 400, the assemblage is locked to the supporting profiled rail 200. Component retention devices 401 are provided on the functional components 400 for this purpose.

The component retention devices 401 secure the joined assemblage against displacement and the functional components 400 against detaching and canting. The bridging modules 300 terminating the joined combination to the left and right incorporate a mechanism for a unilateral mechanically clamping such as for example a screw terminal and for the PE contacting of the internal protective conductor on the supporting profiled rail 200.

Figure 9:
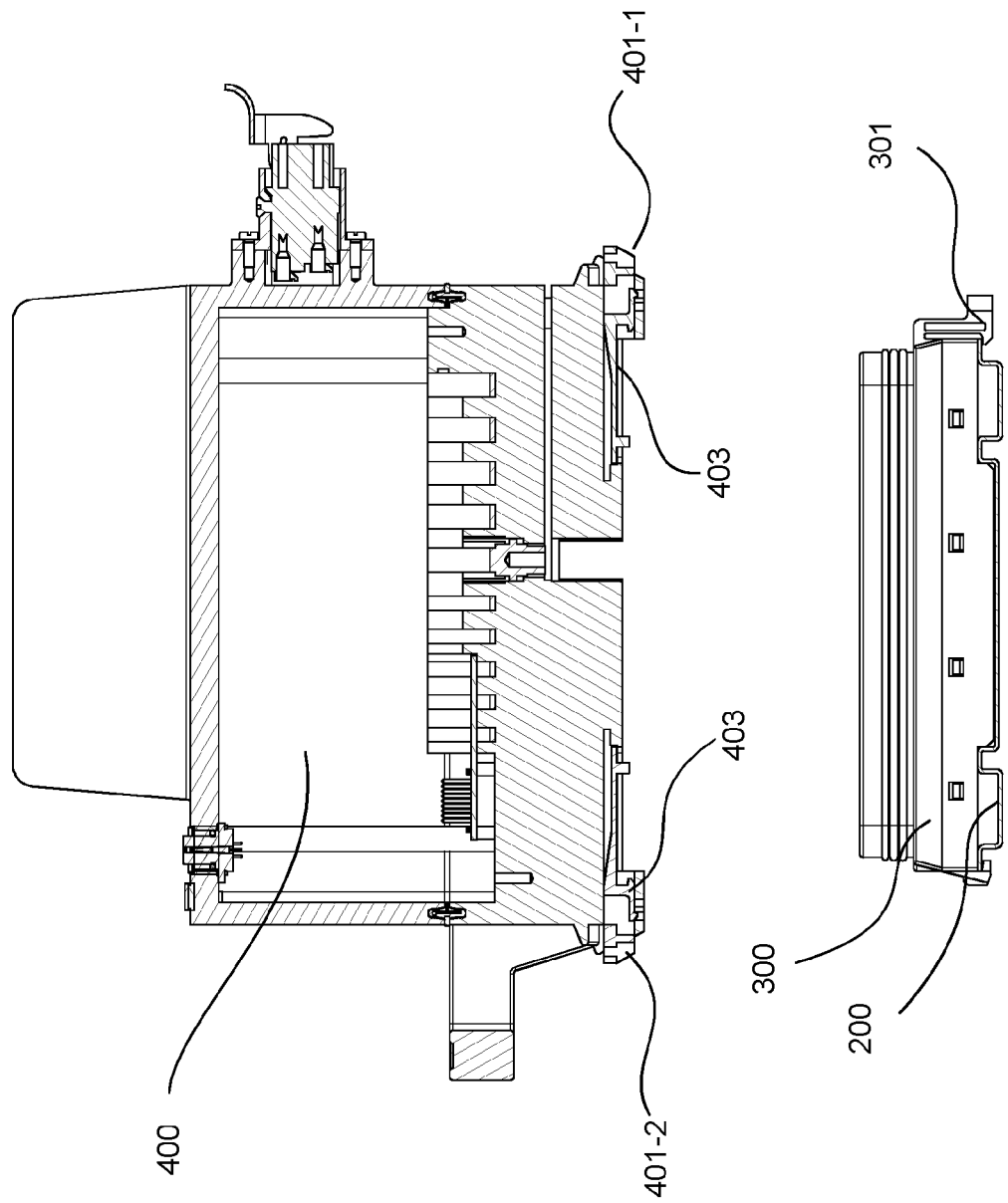
FIG. 9 shows a cross-sectional view through the functional component on the supporting profiled rail.

FIG. 9 shows a cross-sectional view through the functional component 400 on the supporting profiled rail 200 and through the component retention devices 401. Latching of the functional component 400 to the supporting profiled rail 200 is achieved by means of the component retention devices 401-1 and 402 which comprise a laterally actuatable locking slide 403. The first component retention device 401-1 fixes the functional component 400 to a first supporting profile. The second component retention device 401-2 fixes the functional component 400 to a second supporting profile.

Figure 10:
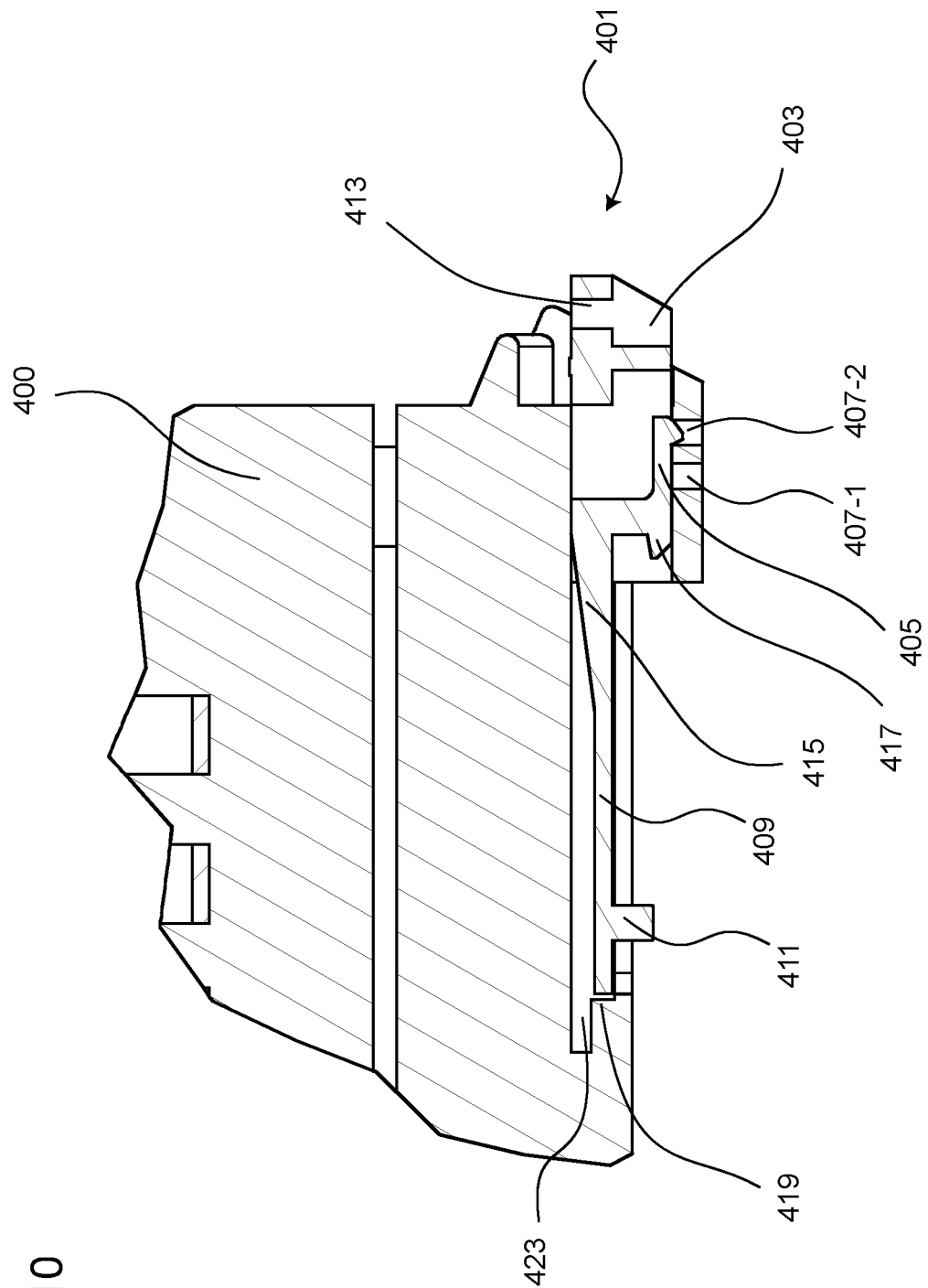
FIG. 10 shows an enlarged cross-sectional view through the functional component and a component retention device.

FIG. 10 shows an enlarged cross-sectional view through the functional component 400 and the component retention device 401 so as to illustrate the locking slide 403. The locking slide 403 is displaceably arranged on the functional component 400 and can be moved between a locking position for locking the functional component 400 on the supporting profiled rail 200 and a release position for seating or removing the functional component 400 on the supporting profiled rail 200. In the locking position, a mounting lug 417 engages behind the supporting profiled rail 200 so as to create a positive locking. In the release position, the mounting lug 417 is retracted.

The locking slide 403 comprises an elastic locking arm 405 which engages into a first latch opening 407-1 or a second latch opening 407-2 depending on position, thereby maintaining the latched locked or release position. When the locking arm 405 is disposed in the first latch opening 407-1, the locking slide 403 is in the locking position. When the locking arm 405 is disposed in the second latch opening 407-2, the locking slide 403 is in the release position.

The locking slide 403 moreover comprises a fixing spring arm 409 for fixing the locking slide 403 in the release position so that the locking slide 403 will be held in the release position until the fixing arm 409 is pressed upward. To this end, the fixing spring arm 409 of the locking slide 403 strikes a stop 419 inside the component retention device 401 and thereby blocks the movement of the locking slide 403. The stop 419 prevents the locking slide 403 from displacing in the direction of the locking position.

When the functional component 400 is set onto the locking rail 200, the fixing spring arm 409 is pressed upward by the pressure element 411 such that the fixing spring arm 409 is pressed into a disengaging position in which the fixing spring arm 409 can enter into the recess 423 upon the displacement of the locking slide 403. In this disengaging position, the locking slide 403 can be moved from the release position into the locking position and subsequently latch into latch opening 407-1. The pressure element 411 is actuated upon the functional component 400 being seated on the supporting profiled rail 200 such that the locking slide 403 can only lock upon a seated functional component 400.

A supporting section 415, which widens outwardly over the fixing spring arm 409, is provided to increase the effect and stability of the fixing spring arm 409. The locking slide 403 additionally comprises an opening 413 for the insertion of a tool such as e.g. a screwdriver for displacing the locking slide 403. The laterally removable locking slide 403 is formed for example as a single plastic part.

The remote locations can be used as conventional star distribution end devices by employing a simple feed-in or as an energy distribution network by employing a connector and distributor module (AV module) to subscribers or nodes. Switching and protective elements, motor switches, bus couplers, or I/Os, etc., can be arranged to the left and right of the AV module in any unrestricted, functionally determined order. Doing so achieves engineering advantages based on the visible separating of low and extra-low voltage components. Multiple remote locations can span a network as a subscriber in any structure su as e.g. linear, tree or ring.

The configured range of energy distribution output no longer requires a central control cabinet. By suitably configuring the accompanying data bus, the order and positions of the remote location's individual components can be checked prior to putting the design-conformant arrangement into operation (remote putting into service, remote service)

The component assembly system 100 enables an assembly of "smart" installation networks for direct and alternating current and cabinet-free distribution in applicable system layouts. The component assembly system can be used in installation or energy distribution fields of application. In distributed automation, an assembly of modular remote locations as functional nodes in "smart" installation networks is possible. In alternative control cabinet concepts, an assembly of modular units in a control cabinet without conductor rails and without control wiring is possible with identical design for IP20 . . . IP6x.

The component assembly system 100 enables the development of remote modular motor switches of high protection class. The component assembly system 100 additionally develops a comprehensively integrated system concept (power & drive, P&D) which solves the task of advantageous remote energy distribution and supply, e.g. external of a control cabinet. The modularity of the component assembly system 100 enables the expansion of the application beyond the modular remote location to "smart" energy distribution through to an alternative control cabinet design. Covering the spectrum of stand-alone functional components as end devices in a conventional star-shaped energy distribution can additionally be achieved.

Figure 11:
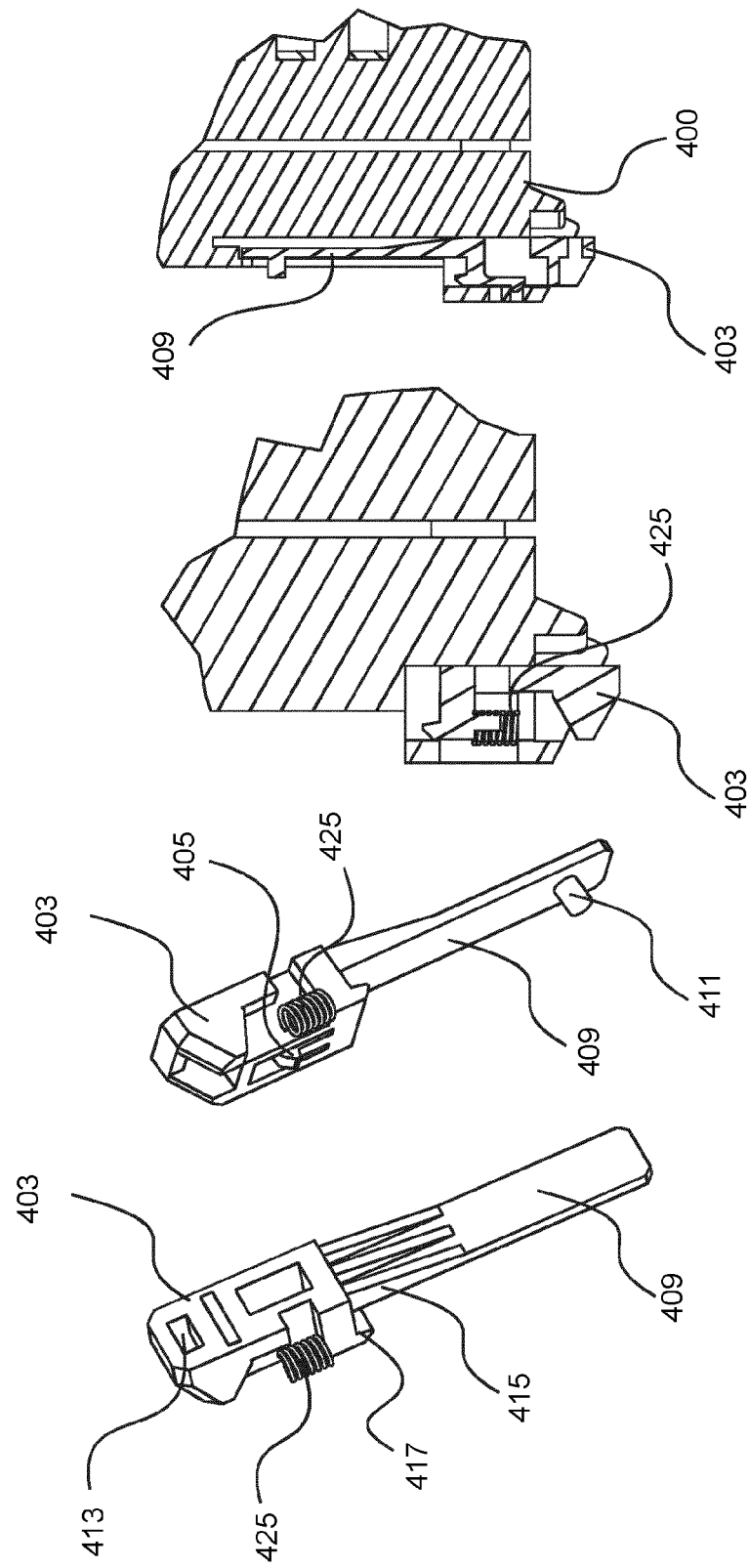
FIG. 11 shows a further view of the locking slide together with the functional component.

FIG. 11 shows a view of the locking slide 403 together with the functional component 400. The locking slide 403 comprises a pressure spring 425 for aiding the motion of the locking slide 403 into the extended locking position bearing the locking slide 403 against a housing wall of the functional component 400. The pressure spring 425 presses the locking slide into the extended locking position. The pressure spring 425 is arranged between a contact surface of the locking slide 403 and a contact surface of the functional component 400.

All of the features defined and depicted in conjunction with individual embodiments of the invention can be provided in various combinations in the inventive object in order to realize their advantageous effects simultaneously.

The protective scope of the present invention is yielded by the claims and is not limited by the features defined in the description or depicted in the figures.

REFERENCE NUMERAL LIST 100 component assembly system
200 supporting profiled rail
300 bridging module
301 module locking device
303 plug contact
305 bridging plug
400 functional component
401 component retention device
401-1 component retention device
401-2 component retention device
403 locking slide
405 locking arm
407-1 latch opening
407-2 latch opening
409 fixing spring arm
411 pressure element
413 opening
415 supporting section
417 mounting lug
419 stop
421-1 housing upper part
421-2 housing bottom part
423 recess
425 pressure spring
500 clamping element/terminal block

The invention claimed is:

1. A component assembly system, comprising:
    a supporting profiled rail;
    a functional component;
    a bridging module configured to electrically connect to the functional component, the bridging module comprising a module retention device configured to hold the bridging module on the supporting profiled rail, wherein the module retention device is configured to produce a snap-lock connection between the bridging module and the supporting profiled rail;
    wherein the functional component is configured to partly seat onto the bridging module, and wherein the functional component comprises a component retention device configured to hold the functional component on the supporting profiled rail.

2. The component assembly system according to claim 1, wherein the module retention device is configured to snap onto the supporting profiled rail by a pivoting of the bridging module.

3. The component assembly system according to claim 1, wherein the module retention device comprises a rigid retention element engaging around the supporting profiled rail and an elastically flexible retention element arranged opposite the rigid retention element, wherein the rigid retention element and the elastically flexible retention element are configured to latch onto the supporting profiled rail.

4. The component assembly system according to claim 1, wherein the supporting profiled rail comprises an undercut profile which interacts with one or more of the module retention device or the component retention device.

5. The component assembly system according to claim 1, wherein at least one of the bridging module or the functional component is displaceable on or along the supporting profiled rail.

6. The component assembly system according to claim 1, comprising a clamping element configured to fix the bridging module against displaceability on the supporting profiled rail, wherein the clamping element is connectable to the bridging module.

7. The component assembly system according to claim 1, wherein the bridging module comprises plug connections configured to electrically connect to the functional component.

8. The component assembly system according to claim 1, wherein the functional component and the bridging module are connectable in a tongue-and-groove connection configured to absorb tensile forces acting on the connection between the bridging module and the functional component along the supporting profiled rail.

9. The component assembly system according to claim 1, wherein the component retention device comprises a displaceable locking slide configured to engage under or positively engage around the supporting profiled rail.

10. The component assembly system according to claim 1, wherein the functional component is configured to be set onto the bridging module, and wherein the module retention device is configured to be locked or blocked from actuating when the module retention device is covered by a housing edge of the functional component.

11. A locking slide configured to:
releasably fix a functional component to a supporting profiled rail and positively engage around the supporting profiled rail;
wherein the locking slide is displaceable into an extended locking position configured to engage under the functional component on the supporting profiled rail; and
wherein the locking slide is displaceable into a retracted release position configured to seat the functional component on the supporting profiled rail, the locking slide comprising a locking arm configured to latch the locking slide into at least one of the extended locking position or the retracted release position.

12. The locking slide according to claim 11, comprising a pressure spring configured to aid a motion of the locking slide into the extended locking position.

13. The locking slide according to claim 11, wherein the locking slide comprises a first latch opening and a second latch opening for the locking arm.

14. The locking slide according to claim 11, wherein the locking slide comprises a fixing spring arm configured to fix the locking slide in the retracted release position.

15. The locking slide according to claim 14, wherein the fixing spring arm comprises a pressure element configured to press the fixing spring arm into a disengaging position in which the locking slide can be displaced into the extended locking position.

16. The locking slide according to claim 11, wherein the locking slide comprises a supporting section configured to support a fixing spring arm.

17. The locking slide according to claim 11 wherein the locking slide comprises an opening configured for insertion of a tool for displacing the locking slide.

\* \* \* \* \*